US006306743B1

(12) United States Patent
Lee

(10) Patent No.: US 6,306,743 B1
(45) Date of Patent: Oct. 23, 2001

(54) METHOD FOR FORMING A GATE ELECTRODE ON A SEMICONDUCTOR SUBSTRATE

(75) Inventor: Byung Hak Lee, Chungchongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/798,942

(22) Filed: Mar. 6, 2001

(30) Foreign Application Priority Data

Nov. 17, 2000 (KR) ................................. 2000-68405

(51) Int. Cl.⁷ .................. H01L 21/3205; H01L 21/4763
(52) U.S. Cl. ...................... 438/592; 257/413; 438/653
(58) Field of Search .................... 257/413, 388, 257/412; 438/592, 585, 653

(56) References Cited

U.S. PATENT DOCUMENTS

| | | | |
|---|---|---|---|
| 5,804,499 | * | 9/1998 | Dehm et al. ..................... 438/592 |
| 5,874,353 | * | 2/1999 | Lin et al. ........................ 438/592 |
| 5,923,999 | * | 7/1999 | Balasubramanyam et al. ..... 438/592 |
| 5,933,741 | | 8/1999 | Tseng . |
| 6,096,630 | * | 8/2000 | Byun et al. ..................... 438/592 |
| 6,103,609 | * | 8/2000 | Lee et al. ....................... 438/592 |
| 6,110,812 | * | 8/2000 | Ho et al. ........................ 438/592 |
| 6,162,715 | * | 12/2000 | Mak et al. ...................... 438/592 |
| 6,165,883 | * | 12/2000 | Hiura ............................. 438/592 |
| 6,180,469 | * | 1/2001 | Pramanick et al. ............. 438/299 |
| 6,194,294 | * | 2/2001 | Lee ................................ 438/585 |
| 6,198,144 | * | 3/2001 | Pan et al. ....................... 257/412 |
| 6,218,252 | * | 4/2001 | Yeo ............................... 438/305 |

\* cited by examiner

*Primary Examiner*—Richard Booth
(74) *Attorney, Agent, or Firm*—Morgan, Lewis & Bockius LLP

(57) ABSTRACT

A method for forming a gate electrode on a semiconductor substrate that includes forming a gate insulating layer on a semiconductor substrate, forming a polysilicon layer on the semiconductor substrate, forming a tungsten silicide layer on the polysilicon layer, forming a diffusion barrier layer on the tungsten silicide layer, forming a tungsten layer on the diffusion barrier layer, crystallizing the diffusion barrier layer, forming a first insulating layer on the tungsten layer, forming a gate electrode, forming an oxide layer, and forming a second insulating layer.

41 Claims, 4 Drawing Sheets

METHOD FOR FORMING A GATE ELECTRODE ON A SEMICONDUCTOR SUBSTRATE

This application claims the benefit of Korean Application No. P2000-68405 filed Nov. 17, 2000, which is hereby incorporated by reference.

BACKGROUND OF THE INVENTION

1. Field of the Invention

The present invention relates to a method for fabricating a semiconductor device, and more particularly, to a method for forming a gate electrode on a semiconductor substrate which reduces line resistance and formation of ohmic contacts.

2. Discussion of the Prior Art

Typically, to reduce gate resistance when forming a gate electrode on a semiconductor device, tungsten(W) having a specific resistance lower than $WSi_x$ by 1 order is deposited on polysilicon. The tungsten is then patterned to form a gate electrode. However, when tungsten reacts with polysilicon at a temperature of 600° C. or greater, a silicide forms at the boundary between tungsten and polysilicon. Therefore, tungsten nitride $WN_x$ is often used as a diffusion barrier layer between the tungsten and polysilicon, thereby forming a gate electrode having a $W/WN_x$/polysilicon structure.

Although $WN_x$ is commonly used as the diffusion barrier layer, TiN may also be used. When W is deposited on TiN by a sputtering method, the grain size of W is smaller than the W/Si structure. In this scenario, resistance increases by a factor of two or more in comparison to pure W. Furthermore, the TiN is oxidized during the selective oxidation of the polysilicon layer. For these reasons, $WN_x$ is commonly used as the diffusion barrier layer. This is disclosed by Y. Akasaka in the article, "Low-Resistivity Poly-Metal Gate Electrode Durable for High-Temperature Processing" (IEEE Trans. Electron Devices, Vol. 43, pp. 1864–1869, 1996), and by B. H. Lee in the article "In-situ Barrier Formation for High Reliable W/barrier/poly-Si Gate Using Denudation of $WN_x$ on Polycrystalline"(IEDM, 1998).

One method for forming a gate electrode on a semiconductor device will be described with reference to the accompanying drawings.

FIGS. 1A to 1E are cross-sectional views showing the steps of a related art method for forming a gate electrode on a semiconductor device.

As shown in FIG. 1A, field oxide layers 12 are formed in a semiconductor substrate 11 in which an active region and a field region are defined. Using thermal oxidation a gate oxide layer 13 is formed on a surface of the semiconductor substrate 11 at a thickness of about 65 Å.

As shown in FIG. 1B, an undoped polysilicon layer 14 is formed by a low pressure chemical vapor deposition (LPCVD) method on the entire surface of the semiconductor substrate 11 at a thickness of about 2000 Å. N+ ions or P+ ions are then implanted into the polysilicon layer 14. When the N+ ions or P+ ions are implanted, As or P ions are implanted into a negative-channel metal oxide semiconductor (NMOS) region while B or $BF_2$ ions are implanted into a positive-channel metal oxide semiconductor (PMOS) region using a photoresist as a mask.

Then an annealing process is performed in the polysilicon layer 14 for ten minutes and at a temperature of 800° C. to activate the impurity ions.

As shown in FIG. 1C, the semiconductor substrate 11 is washed by HF solution and then $WN_x$ layer 15 is formed on the polysilicon layer 14 at a thickness of 50~100 Å. A tungsten layer 16 is formed on the $WN_x$, layer 15 at a thickness of about 1000 Å and a first insulating layer 17 is deposited on the tungsten layer 16 at a thickness of about 2000 Å.

The $WN_x$ layer 15 is used as a diffusion barrier between the tungsten layer 16 and the polysilicon layer 14, and the first insulating layer 17 is used as a gate cap insulating layer later.

As shown in FIG. 1D, a photoresist(not shown) is deposited on the first insulating layer 17 and then patterned by exposure and developing processes to define a gate electrode region. The first insulating layer 17, the tungsten layer 16, the $WN_x$ layer 15, the polysilicon layer 14 and the gate oxide layer 13 are selectively removed using the patterned photoresist as a mask to form a gate electrode 18 having a structure consisting of a tungsten layer 16, a $WN_x$ layer 15 and a polysilicon layer 14.

As shown in FIG. 1E, selective oxidation is performed in the gate electrode 18 to partially form an oxide layer (not shown) at the sides of the gate electrode 18. Then a second insulating layer is formed on the entire surface of the semiconductor substrate 11. The second insulating layer is etched back to form second insulating layer sidewalls 19 on both sides of the gate electrode 18 and the first insulating layer 17.

However, the related art method for forming a gate electrode on a semiconductor device has several problems. When $W/WN_x$ is deposited on polysilicon, a W—Si—O—N layer forms at the boundary between tungsten and polysilicon during a later annealing process having a temperature of 800° C. or more. Thus, boundary resistance between tungsten and polysilicon increases thereby slowing the operation of the semiconductor device.

SUMMARY OF THE INVENTION

Accordingly, the present invention is directed to a method for forming a gate electrode on a semiconductor substrate that substantially obviates one or more of the problems due to limitations and disadvantages of the related art.

An object of the present invention is to provide a method for forming a gate electrode on a semiconductor substrate that reduces the boundary resistance between tungsten and polysilicon, thereby preventing the operational speed of the semiconductor device from being slowed.

Additional objects and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in one aspect of the present invention there is provided a method for forming a gate electrode on a semiconductor substrate that includes forming a gate insulating layer on a semiconductor substrate, forming a polysilicon layer on the semiconductor substrate, forming a tungsten silicide layer on the polysilicon layer, forming a diffusion barrier layer on the tungsten silicide layer, forming a tungsten layer on the diffusion barrier layer, crystallizing the diffusion barrier layer, forming a first insulating layer on the tungsten layer, forming a gate electrode, forming an oxide layer, and forming a second insulating layer.

In another aspect, the present invention provides a method for forming a gate electrode on a semiconductor substrate that includes forming a gate insulating layer on a semiconductor substrate, forming a polysilicon layer on the semiconductor substrate, forming a tungsten silicide layer on the polysilicon layer, forming a diffusion barrier layer on the tungsten silicide layer, forming a tungsten layer on the diffusion barrier layer, crystallizing the diffusion barrier layer by performing an annealing process in the semiconductor substrate, and forming a first insulating layer on the tungsten layer. Then a gate electrode is formed by selectively patterning the first insulating layer, the tungsten layer, the diffusion barrier layer, the tungsten silicide layer, the polysilicon layer, and the gate insulating layer. Finally, a selective oxidation process is performed in the semiconductor substrate and a second insulating layer is formed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like elements.

FIGS. 2A to 2F are cross-sectional views showing the process steps of a method for forming a gate electrode on a semiconductor substrate according to the present invention.

Figure 1A:
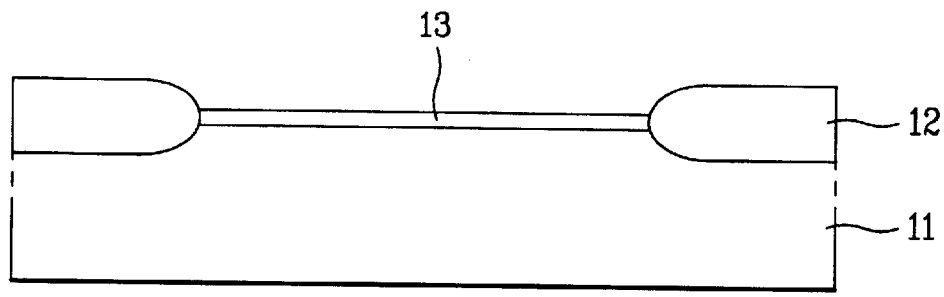
FIGS. 1A to 1E are cross-sectional views showing the process steps of a related art method for forming a gate electrode on a semiconductor substrate.
Figure 1B:
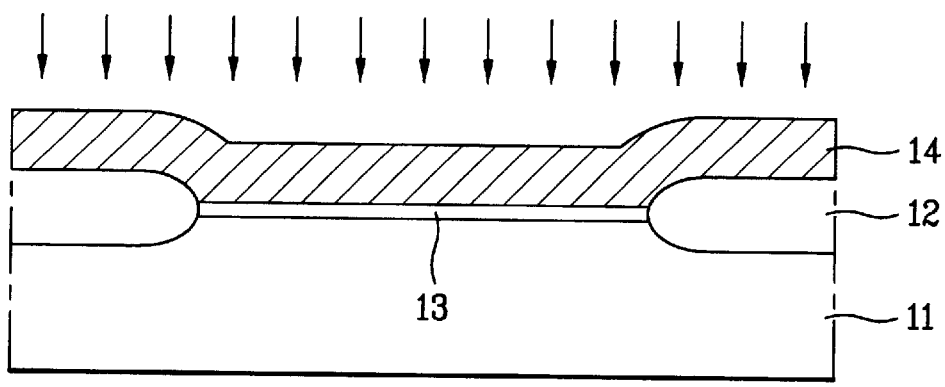
Figure 1C:
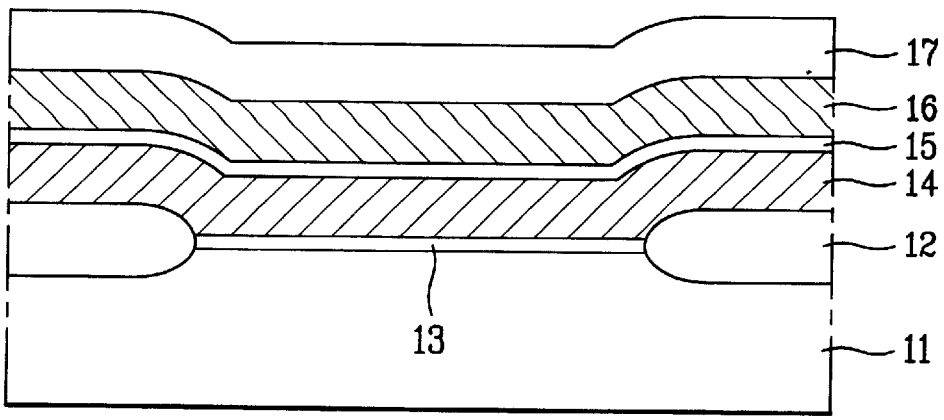
Figure 1D:
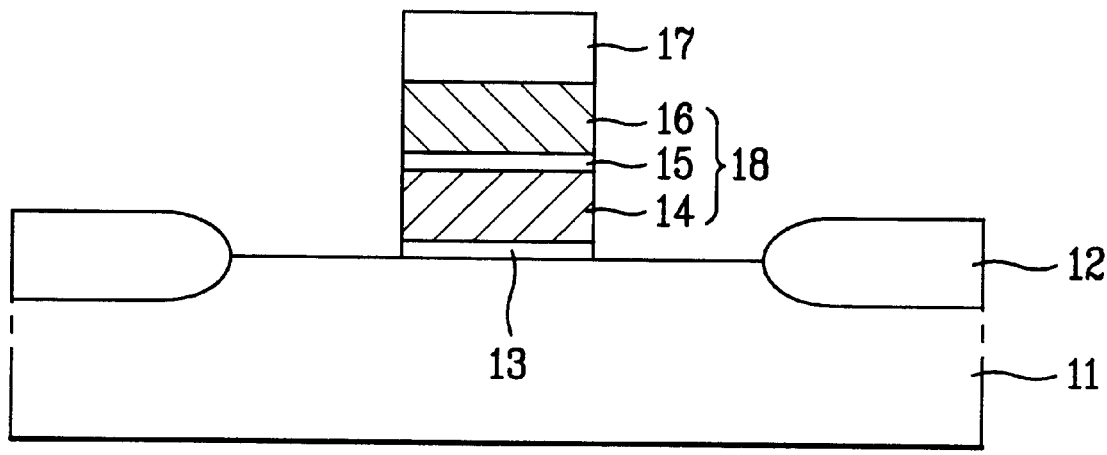
Figure 1E:
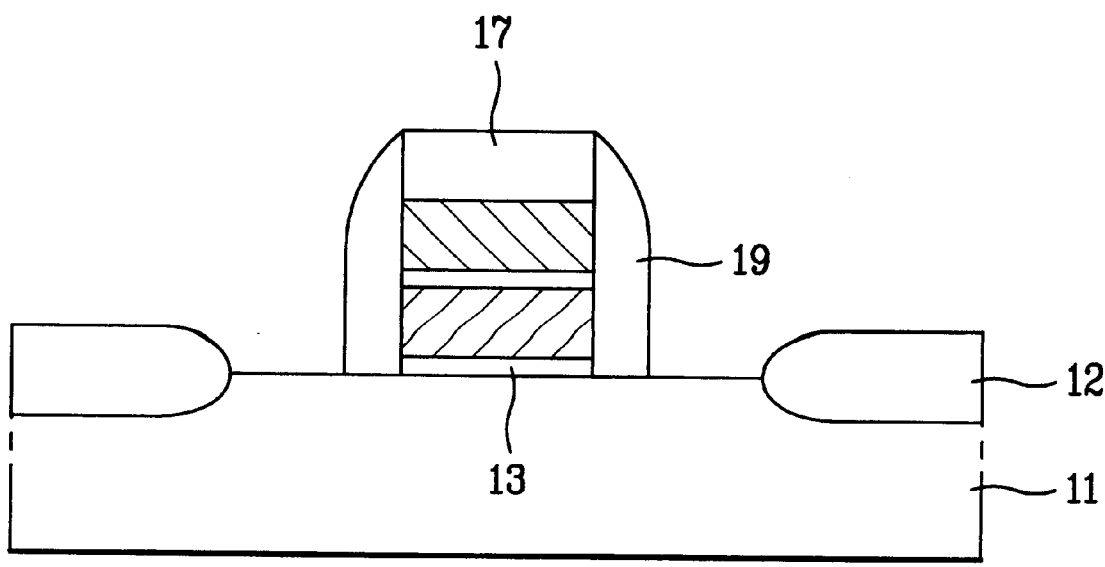
Figure 2A:
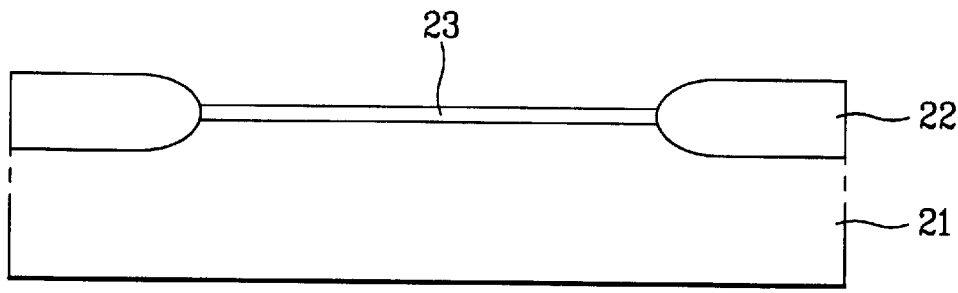
FIGS. 2A to 2F are cross-sectional views showing the process steps of a method for forming a gate electrode on a semiconductor substrate according to the present invention.

As shown in FIG. 2A, field oxide layers 22 are formed in a semiconductor substrate 21 in which an active region and a field region are defined. A gate oxide layer 23 is formed by thermal oxidation on a surface of the semiconductor substrate 21 at a thickness of 30~80 Å. Preferably, the field oxide layers 22 are formed by a local oxidation of silicon (LOCKS) process or by a shallow trench isolation (STI) process.

Figure 2B:
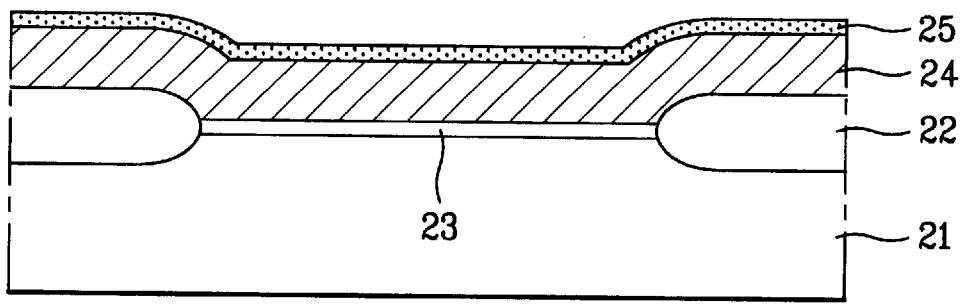

As shown in FIG. 2B, a doped polysilicon layer 24 is formed by an LPCVD method on the entire surface of the semiconductor substrate 21, including the gate oxide layer 23, at a thickness of approximately 1000 Å. A tungsten silicide ($WSi_x$) layer 25 is then formed on the polysilicon layer 24 at a thickness of approximately 100 Å. Preferably, the tungsten silicide layer 25 has a silicon to tungsten (Si/W) ratio of 2.0~3.0.

Figure 2C:
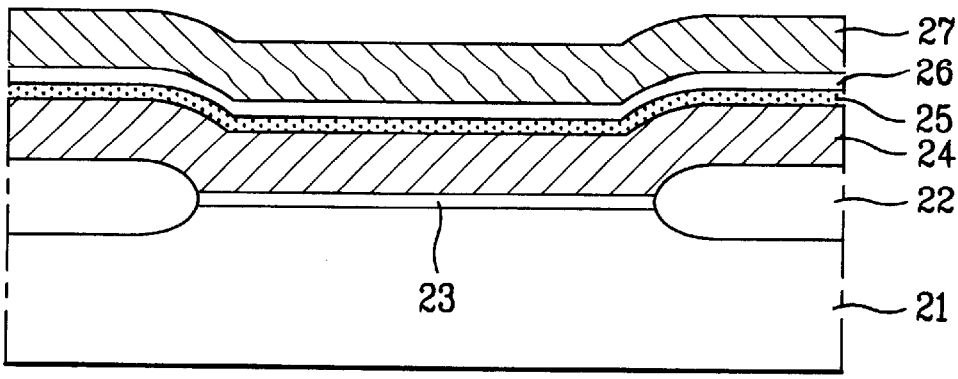

As shown in FIG. 2C, a $WN_x$ layer 26 which will be used as a diffusion barrier layer, is formed on the tungsten silicide layer 25 at a thickness of approximately 100 Å. Then a tungsten layer 27 is deposited on the $WN_x$ layer 26 at a thickness of about 900 Å.

The amorphous $WN_x$ layer 26 consists of 5~55% of nitrogen (N). In an alternative embodiment of the present invention, one or more $WN_x$ layers containing N may be deposited on the $WN_x$ layer 26 to improve thermal stability. One skilled in the art will appreciate that the additional $WN_x$ layers may contain different amounts of N.

Figure 2D:
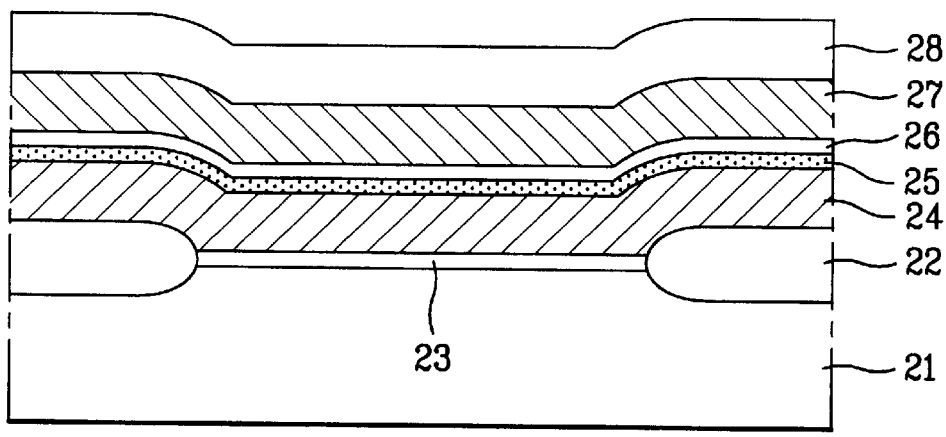

As shown in FIG. 2D, the $WN_x$ layer 26 is crystallized by performing an annealing process in the semiconductor substrate 21 at a temperature of 600–800° C. for 1~60 minutes in an ambient vapor of $N_2/H_2$. The $WN_x$ layer 26 is crystallized into $WN_2$, which has excellent barrier characteristics. Then, a first insulating layer 28, which will be used as a gate cap insulating layer, is deposited on the tungsten layer 27 at a thickness of 2000 Å.

Figure 2E:
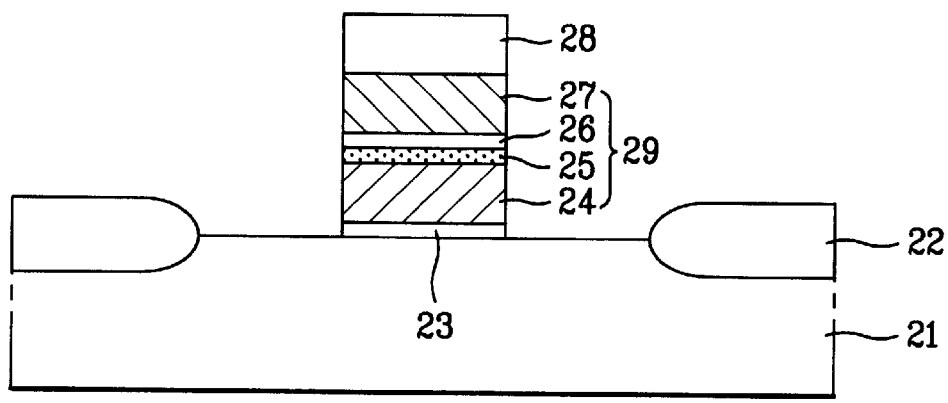

As shown in FIG. 2E, a photoresist(not shown) is deposited on the first insulating layer 28 and then patterned by exposure and developing processes to define a gate electrode region. The first insulating layer 28, the tungsten layer 27, the $WN_x$ layer 26, the tungsten silicide layer 25, the polysilicon layer 24 and the gate oxide layer 23 are selectively removed using the patterned photoresist as a mask to form a gate electrode 29. The gate electrode 29 has a structure consisting of a tungsten layer 27, a $WN_x$ layer 26, a tungsten silicide layer 25, and a polysilicon layer 24.

Figure 2F:
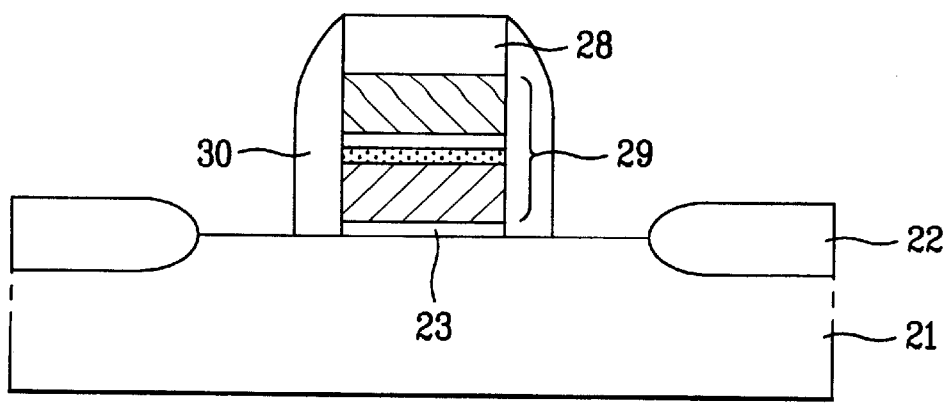

As shown in FIG. 2F, selective oxidation is performed in the semiconductor substrate 21 at a temperature of 800~1000° C. in an ambient vapor of $H_2O/H_2$ to form an oxide layer (not shown) at the sides of the gate electrode 29. Preferably, the selective oxidation process, using argon (Ar) and nitrogen ($N_2$) as carrier gases, is performed for 1~60 minutes with a $P_{H2O}/P_{H2}$ of 1E-6~1.

After the oxidation is conducted, a second insulating layer is formed on the entire surface of the semiconductor substrate 21. The second insulating layer is then etched back to form second insulating layer sidewalls 30 at both sides of the gate electrode 29 and the first insulating layer 28.

As previously discussed, the method for forming a gate electrode on a semiconductor substrate according to the present invention has various advantages.

First, since an ohmic contact is formed between polysilicon and tungsten silicide by depositing tungsten silicide on the polysilicon, the boundary resistance is reduced.

Second, amorphous $WN_x$ is formed between tungsten silicide and tungsten and is crystallized by performing an annealing process at a temperature of 600~800° C. to generate $W_2N$, which has excellent barrier characteristic. Therefore, it is possible to inhibit the formation of silicide from tungsten in a later annealing process.

Finally the tungsten silicide and $WN_x$ layers formed between the tungsten and polysilicon layers prevent the boundary resistance between the tungsten and polysilicon from increasing due to the thermal oxidation of the diffusion barrier layer after forming the gate electrode.

It will be apparent to those skilled in the art that various modifications and variations can be made in the method for forming a gate electrode of the present invention without departing from the spirit or scope of the invention. Thus, it is intended that the present invention cover the modifications and variations of this invention provided they come within the scope of the appended claims and their equivalents.

What is claimed is:

1. A method for forming a gate electrode on a semiconductor substrate, the method comprising the steps of:

forming a gate insulating layer on a semiconductor substrate;

forming a polysilicon layer on the semiconductor substrate;

forming a tungsten silicide layer on the polysilicon layer;

forming a diffusion barrier layer on the tungsten silicide layer;

forming a tungsten layer on the diffusion barrier layer;

crystallizing the diffusion barrier layer;

forming a first insulating layer on the tungsten layer;

forming a gate electrode;

forming an oxide layer; and forming a second insulating layer.

2. The method of claim 1, wherein the gate insulating layer is formed at a thickness of approximately 30~80Å by thermally oxidizing the semiconductor substrate.

3. The method of claim 1, wherein the polysilicon layer is formed at a thickness of approximately 1000Å by an LPCVD process.

4. The method of claim 1, wherein said step of forming a polysilicon layer includes forming a doped polysilicon layer.

5. The method of claim 1, wherein the tungsten silicide layer is formed at a thickness of approximately 100 Å.

6. The method of claim 1, wherein the tungsten silicide layer has a Si to W ratio of approximately 2.0~3.0.

7. The method of claim 1, wherein the diffusion barrier layer has a thickness of approximately 100 Å.

8. The method of claim 1, wherein said step of forming a diffusion barrier layer includes forming an amorphous nitride tungsten layer.

9. The method of claim 8, wherein the amorphous nitride tungsten layer consists of approximately 5~55% of a N.

10. The method of claim 1, wherein said step of forming a diffusion barrier layer includes stacking a plurality of nitride tungsten layers, wherein each nitride tungsten layer may consist of a different amount of a N.

11. The method of claim 1, wherein the tungsten layer has a thickness of approximately 900 Å.

12. The method of claim 1, wherein said step of crystallizing the diffusion barrier layer is performed by an annealing process in the semiconductor substrate.

13. The method of claim 12, wherein the annealing process is performed at a temperature of approximately 600~800° C. for approximately 1~60 minutes.

14. The method of claim 1, wherein the first insulating layer has a thickness of approximately 2000 Å.

15. The method of claim 1, wherein said step of forming a gate electrode includes selectively patterning the first insulating layer, the tungsten layer, the diffusion barrier layer, the tungsten silicide layer, the polysilicon layer, and the gate insulating layer.

16. The method of claim 15, wherein said step of forming a gate electrode by selectively patterning the first insulating layer, the tungsten layer, the diffusion barrier layer, the tungsten silicide layer, the polysilicon layer, and the gate insulating layer includes the steps of:

forming a photoresist on the first insulating layer;

patterning the photoresist; and selectively removing the first insulating layer, the tungsten layer, the diffusion barrier layer, the tungsten silicide layer, the polysilicon layer, and the gate insulating layer by using the photoresist as a mask.

17. The method of claim 1, wherein said step of forming an oxide layer includes performing a selective oxidation process in the substrate.

18. The method of claim 17, wherein the selective oxidation process is performed in an ambient vapor of $H_2O/H_2$.

19. The method of claim 17, wherein the selective oxidation process is performed for approximately 1~60 minutes at a temperature of approximately 800~1000° C.

20. The method of claim 17, wherein the selective oxidation process is performed with a $P_{H2O}/P_{H2}$ of 1E-6~1.

21. The method of claim 17, wherein performing a selective oxidation process includes using a carrier gas of one or more of Ar and $N_2$.

22. The method of claim 1, wherein said step of forming a second insulating layer includes forming a second insulating layer on a side of said first insulating layer and on a side of said gate electrode.

23. A method for forming a gate electrode on a semiconductor substrate, the method comprising the steps of:

forming a gate insulating layer on a semiconductor substrate;

forming a polysilicon layer on the semiconductor substrate;

forming a tungsten silicide layer on the polysilicon layer;

forming a diffusion barrier layer on the tungsten silicide layer;

forming a tungsten layer on the diffusion barrier layer;

crystallizing the diffusion barrier layer by performing an annealing process in the semiconductor substrate;

forming a first insulating layer on the tungsten layer;

forming a gate electrode by selectively patterning the first insulating layer, the tungsten layer, the diffusion barrier layer, the tungsten silicide layer, the polysilicon layer, and the gate insulating layer;

performing a selective oxidation process in the semiconductor substrate; and forming a second insulating layer.

24. The method of claim 23, wherein the gate insulating layer is formed at a thickness of approximately 30~80Å by thermally oxidizing the semiconductor substrate.

25. The method of claim 23, wherein the polysilicon layer is formed at a thickness of approximately 1000Å by an LPCVD process.

26. The method of claim 23, wherein said step of forming a polysilicon layer includes forming a doped polysilicon layer.

27. The method of claim 23, wherein the tungsten silicide layer is formed at a thickness of approximately 100 Å.

28. The method of claim 23, wherein the tungsten silicide layer has a Si to W ratio of approximately 2.0~3.0.

29. The method of claim 23, wherein the diffusion barrier layer has a thickness of approximately 100 Å.

30. The method of claim 23, wherein said step of forming a diffusion barrier layer includes forming an amorphous nitride tungsten layer.

31. The method of claim 30, wherein the amorphous nitride tungsten layer contains approximately 5~55% of a N.

32. The method of claim 23, wherein said step of forming a diffusion barrier layer includes stacking a plurality of nitride tungsten layers, wherein each nitride tungsten layer may have a different amount of a N.

33. The method of claim 23, wherein the tungsten layer has a thickness of approximately 900 Å.

34. The method of claim 23, wherein the annealing process is performed at a temperature of approximately 600~800° C. for approximately 1~60 minutes.

35. The method of claim 23, wherein the first insulating layer has a thickness of approximately 2000 Å.

36. The method of claim 23, wherein said step of forming a gate electrode by selectively patterning the first insulating layer, the tungsten layer, the diffusion barrier layer, the tungsten silicide layer, the polysilicon layer, and the gate insulating layer includes the steps of:

forming a photoresist on the first insulating layer;

patterning the photoresist; and selectively removing the first insulating layer, the tungsten layer, the diffusion barrier layer, the tungsten silicide layer, the polysilicon layer, and the gate insulating layer by using the photoresist as a mask.

37. The method of claim 23, wherein the selective oxidation process is performed in an ambient vapor of $H_2O/H_2$.

38. The method of claim 23, wherein the selective oxidation process is performed for approximately 1~60 minutes at a temperature of approximately 800~1000° C.

39. The method of claim 23, wherein the selective oxidation process is performed by $P_{H2O}/P_{H2}$ of 1E-6~1.

40. The method of claim 23, wherein said step of performing a selective oxidation process includes using a carrier gas of one or more of an Ar and $N_2$.

41. The method of claim 23, wherein said step of forming a second insulating layer includes forming a second insulating layer on a side of said first insulating layer and on a side of said gate electrode.

* * * * *